United States Patent
Yoon et al.

(10) Patent No.: US 10,692,428 B2
(45) Date of Patent: Jun. 23, 2020

(54) ORGANIC LIGHT-EMITTING DISPLAY DEVICE AND METHOD OF DRIVING THE SAME

(71) Applicant: Samsung Display Co., Ltd., Yongin-si (KR)

(72) Inventors: Ju Won Yoon, Yongin-si (KR); Moo Soon Ko, Yongin-si (KR); Seong Jun Lee, Yongin-si (KR); Deuk Myung Ji, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 82 days.

(21) Appl. No.: 15/790,891

(22) Filed: Oct. 23, 2017

(65) Prior Publication Data

US 2018/0286308 A1 Oct. 4, 2018

(30) Foreign Application Priority Data

Apr. 4, 2017 (KR) .......................... 10-2017-0043650

(51) Int. Cl.
*G09G 3/3233* (2016.01)
*H01L 27/32* (2006.01)
*H01L 51/52* (2006.01)

(52) U.S. Cl.
CPC ....... *G09G 3/3233* (2013.01); *H01L 27/3276* (2013.01); *H01L 51/5203* (2013.01); *G09G 2300/0452* (2013.01); *G09G 2300/0852* (2013.01); *G09G 2340/0435* (2013.01)

(58) Field of Classification Search
None
See application file for complete search history.

(56) References Cited

U.S. PATENT DOCUMENTS

| | | | |
|---|---|---|---|
| 7,573,441 B2 | 8/2009 | Kwon | |
| 8,421,717 B2* | 4/2013 | Ono | G09G 3/3233 345/76 |
| 8,872,736 B2 | 10/2014 | Shin | |
| 9,208,727 B2 | 12/2015 | Lee et al. | |
| 2004/0196239 A1* | 10/2004 | Kwon | G09G 3/325 345/92 |
| 2007/0268217 A1* | 11/2007 | Ahn | G09G 3/325 345/76 |
| 2008/0158114 A1 | 7/2008 | Kim | |
| 2014/0085276 A1* | 3/2014 | Jang | G09G 3/2007 345/204 |

FOREIGN PATENT DOCUMENTS

| | | |
|---|---|---|
| KR | 10-0502912 | 7/2005 |
| KR | 10-0666549 | 1/2007 |
| KR | 10-0821055 | 4/2008 |
| KR | 10-2014-0134046 | 11/2014 |

* cited by examiner

*Primary Examiner* — Matthew Yeung
(74) *Attorney, Agent, or Firm* — H.C. Park & Associates, PLC

(57) ABSTRACT

An organic light-emitting display device having improved display quality, the organic light-emitting display device may include pixels coupled to scan lines and data lines. Each of the pixels may include a storage unit configured to store a data signal supplied to the data lines. The capacitance of the storage unit may be changed depending on a driving frequency.

18 Claims, 8 Drawing Sheets

ORGANIC LIGHT-EMITTING DISPLAY DEVICE AND METHOD OF DRIVING THE SAME

CROSS-REFERENCE TO RELATED APPLICATION

This application claims priority from and the benefit of Korean Patent Application No. 10-2017-0043650, filed on Apr. 4, 2017, which is hereby incorporated by reference for all purposes as if fully set forth herein.

BACKGROUND

Field

Exemplary embodiments of the present invention relate to an organic light-emitting display device and a method of driving the same, and more particularly, to an organic light-emitting display device having improved display quality, and a method of driving the same.

Discussion of the Background

With the development of information technology, the importance of a display device that is a connection medium between a user and information has been emphasized. Because of the importance of the display device, the use of various display devices, such as a liquid crystal display (LCD) device and an organic light-emitting display device, has increased.

Among the various display devices, the organic light-emitting display device displays an image using organic light-emitting diodes, which emit light via a mechanism utilizing re-coupling of electrons and holes. The organic light-emitting display device has an advantage in that it has a fast response speed and is operated with low power consumption.

Recently, a method of driving such an organic light-emitting display device using a low frequency mode and a high frequency mode is currently in use. If the organic light-emitting display device is driven in the low frequency mode, power consumption may be minimized. If the high frequency mode is used for driving, a video or the like may be clearly displayed. For this reason, an organic light-emitting display device capable of providing the optimum image quality in response to the low frequency mode and the high frequency mode is desired.

The above information disclosed in this Background section is only for enhancement of understanding of the background of the inventive concepts. Therefore, it may contain information that does not form the prior art that was already known to a person of ordinary skill in the art or was publically available prior to an effective filing date of subject matter disclosed herein.

SUMMARY

Exemplary embodiments of the present invention provide an organic light-emitting display device having improved display quality, and a method of driving the same.

Additional features of the invention will be set forth in the description which follows, and in part will be apparent from the description, or may be learned by practice of the invention.

An exemplary embodiment of the present invention discloses an organic light-emitting display device including pixels coupled to scan lines and data lines. Each of the pixels includes a storage unit configured to store a data signal supplied to the data lines. The storage unit is set to a first capacitance in the case that the organic light-emitting display device is driven with a first driving frequency, and the storage unit is set to a second capacitance greater than the first capacitance in the case that the organic light-emitting display device is driven with a second driving frequency less than the first driving frequency.

Each of the pixels disposed in an i-th (i is a natural number) horizontal line may include: an organic light-emitting diode; a first transistor including a first electrode, and configured to control, in response to the data signal, current flowing from a first driving power supply coupled to the first electrode to a second driving power supply via the organic light-emitting diode; and the storage unit coupled between a gate electrode of the first transistor and the first driving power supply.

The storage unit may include: a first capacitor coupled between the first driving power supply and the gate electrode of the first transistor; and a second capacitor and a control transistor coupled in parallel with the first capacitor between the first driving power supply and the gate electrode of the first transistor.

The second capacitor may be set to a capacitance greater than a capacitance of the first capacitor.

The control transistor may be coupled between the second capacitor and the gate electrode of the first transistor.

The control transistor may be coupled between the second capacitor and the first driving power supply.

The control transistor may include: a first control transistor coupled between the second capacitor and the first driving power supply; and a second control transistor coupled between the second capacitor and the gate electrode of the first transistor.

The control transistor may be turned off in the case that the organic light-emitting display device is driven with the first driving frequency, and may be turned on in the case that the organic light-emitting display device is driven with the second driving frequency less than the first driving frequency.

The organic light-emitting display device may further include a control signal supply unit configured to supply a control signal to a control line coupled in common with the pixels such that the control transistor is turned off in the case that the organic light-emitting display device is driven with the first driving frequency, and the control transistor is turned on in the case that the organic light-emitting display device is driven with the second driving frequency.

Each of the pixels may further include a second transistor coupled between the corresponding data line and the gate electrode of the first transistor and configured to be turned on in response to a scan signal supplied to an i-th scan line.

The organic light-emitting display device may further include: a scan driver configured to supply a scan signal to the scan lines; and a data driver configured to supply the data signal to the data lines.

The organic light-emitting display device may further include an emission driver configured to supply an emission control signal to emission control lines coupled to the pixels.

Each of the pixels may further include: a second transistor coupled between the first electrode of the first transistor and the corresponding data line, and configured to be turned on in response to a scan signal is supplied to an i-th scan line; a third transistor coupled between a second electrode and the gate electrode of the first transistor, and configured to be turned on in response to the scan signal is supplied to the i-th scan line; a fourth transistor coupled between the gate electrode of the first transistor and an initialization power supply, and configured to be turned on in response to the scan signal is supplied to the i−1-th scan line; a fifth transistor coupled between an anode electrode of the organic light-emitting diode and the initialization power supply, and configured to be turned on in response to the scan signal is supplied to the i-th scan line; a sixth transistor coupled between the first electrode of the first transistor and the first driving power supply, and configured to be turned off in response to an emission control signal is supplied to an i-th emission control line; and a seventh transistor coupled between the second electrode of the first transistor and the anode electrode of the organic light-emitting diode, and configured to be turned off in response to the emission control signal supplied to the i-th emission control line.

The emission control signal to be supplied to the i-th emission control line may overlap the scan signal to be supplied to the i−1-th scan line and the i-th scan line.

An exemplary embodiment of the present invention also discloses a method of driving an organic light-emitting display device comprising pixels each of which includes a storage unit suitable for storing a data signal. When the organic light-emitting display device is driven with a first driving frequency, the storage unit may be set to a first capacitance. When the organic light-emitting display device is driven with a second driving frequency less than the first driving frequency, the storage unit may be set to a second capacitance different from the first capacitance.

The second capacitance may be set to a value higher than the first capacitance.

The storage unit may include a first capacitor and a second capacitor. When the organic light-emitting display device is driven with the first driving frequency, the storage unit may be set to a capacitance of the first capacitor. When the organic light-emitting display device is driven with the second driving frequency, the storage unit may be set to a sum of capacitances of the first and second capacitors.

The second capacitor may be set to a capacitance greater than a capacitance of the first capacitor.

A scan signal to be supplied to the pixels when the organic light-emitting display device is driven with the first driving frequency, may be set to a first width. A scan signal to be supplied to the pixels when the organic light-emitting display device is driven with the second driving frequency, may be set to a second width equal to or greater than the first width.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
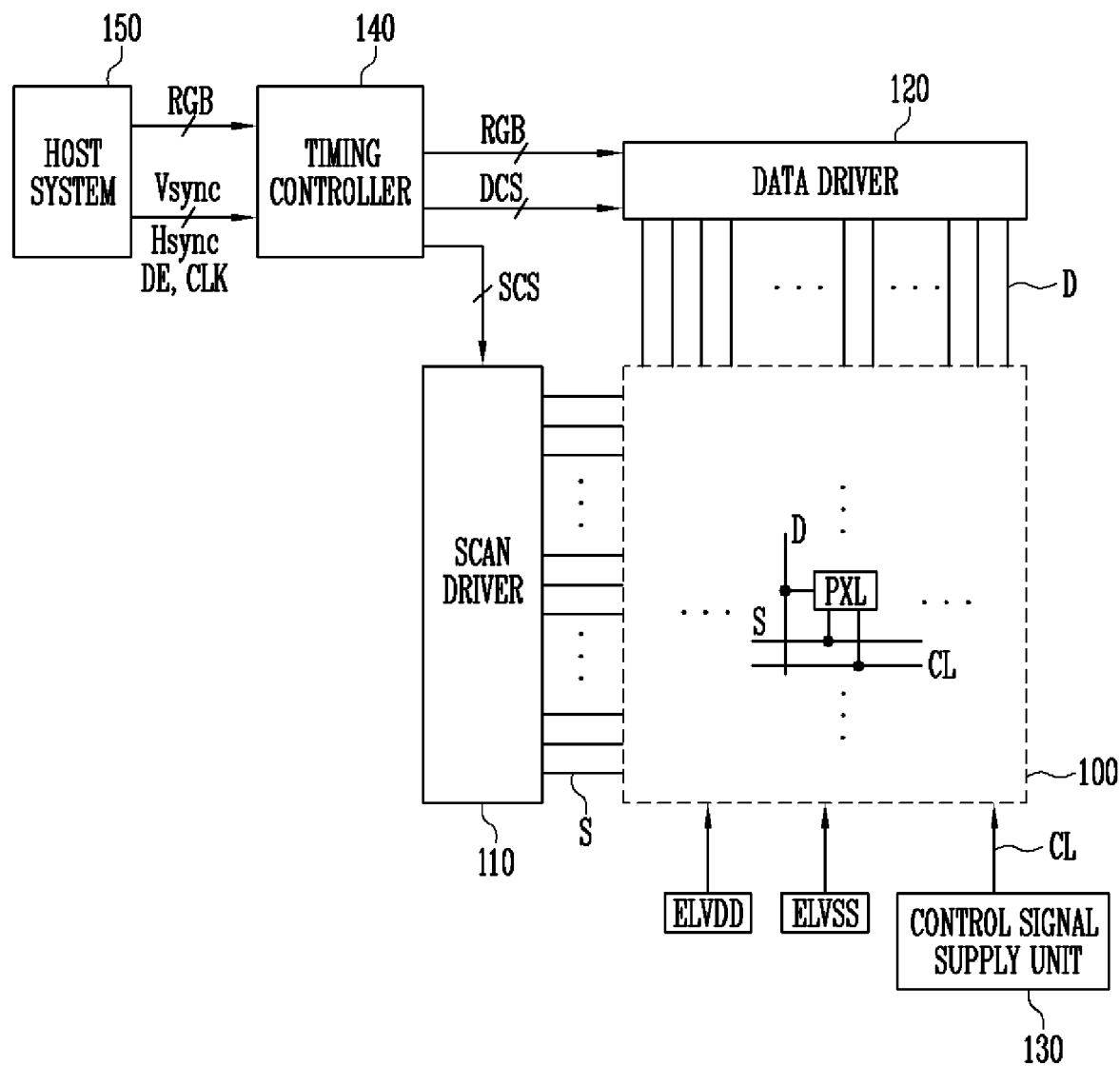
FIG. 1 is a schematic diagram illustrating an organic light-emitting display device in accordance with an exemplary embodiment of the inventive concepts.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein Hereinafter, embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the embodiments to those skilled in the art.

It is to be noted that the present disclosure is not limited to the embodiments but can be embodied in various other ways. In this specification, "connected/coupled" refers to one component not only directly coupling another component but also indirectly coupling another component through an intermediate component. Reference now should be made to the drawings, in which the same reference numerals are used throughout the different drawings to designate the same or similar components.

FIG. 1 is a schematic diagram illustrating an organic light-emitting display device in accordance with an exemplary embodiment of the inventive concepts.

Referring to FIG. 1, the display device in accordance with an exemplary embodiment of the inventive concepts may include a pixel unit 100, a scan driver 110, a data driver 120, a control signal supply unit 130, a timing controller 140, and a host system 150.

The host system 150 may supply image RGB data to the timing controller 140 through a predetermined interface. The host system 150 may supply timing signals Vsync, Hsync, DE, and CLK to the timing controller 140.

The timing controller 140 may generate a scan driving control signal SCS and a data driving control signal DCS, based on timing signals, such as image RGB data, a vertical synchronization signal Vsync, a horizontal synchronization signal Hsync, a data enable signal DE, and a clock signal CLK, outputted from the host system 150. The scan driving control signal SCS generated from the timing controller 140 may be supplied to the scan driver 110, and the data driving control signal DCS may be supplied to the data driver 120. The timing controller 140 may rearrange RGB data received from an external device and supply the rearranged RGB data to the data driver 120.

The scan driving control signal SCS may include a scan start pulse and clock signals. The scan start pulse may control a first timing of a scan signal. The clock signals may be used to shift the scan start pulse.

The data driving control signal DCS may include a source start pulse and clock signals. The source start pulse may control the time at which data sampling starts. The clock signals may be used to control the sampling operation.

The scan driver 110 may supply a scan signal to scan lines S in response to the scan driving control signal SCS. For example, the scan driver 110 may sequentially supply the scan signal to the scan lines S. If the scan signal is sequentially supplied to the scan lines S, pixels PXL may be selected on a horizontal line basis. For this operation, the scan signal may be set to a gate-on voltage so that transistors included in the pixels PXL can be turned on.

The data driver 120 may supply a data signal to data lines D in response to the data driving control signal DCS. The data signal supplied to the data lines D may be supplied to pixels PXL selected by the scan signal For this operation, the data driver 120 may supply the data signal to the data lines D in synchronization with the scan signal.

The control signal supply unit 130 may a control signal to a control line CL in response to a driving frequency. The control line CL may be coupled in common to the pixels PXL. The control signal supply unit 130 may supply a first control signal in response to a first driving frequency, and may supply a second control signal in response to a second driving frequency less than the first driving frequency. Here, the first control signal may be set to a gate-off voltage so that the transistors included in the pixels PXL can be turned off. The second control signal may be set to a gate-on voltage so that the transistors included in the pixels PXL can be turned on.

In addition, the control signal supply unit 130 may receive, from the timing controller 140, information about the driving frequency that is being currently driven. The control signal supply unit 130 may be integrally formed with the timing controller 140. In this case, the control line CL may be supplied with a control signal from the timing controller 140.

The pixel unit 100 may include pixels PXL, which are disposed to be coupled to the data lines D, the scan lines S, and the control line CL. The pixels PXL may be supplied with a first driving power supply ELVDD and a second driving power supply ELVSS from an external device.

Each pixel PXL may be selected when a scan signal is supplied to the corresponding scan line S coupled thereto, and then be supplied with a data signal from the data line D. The pixel PXL supplied with the data signal may control, in response to the data signal, current flowing from the first driving power supply ELVDD to the second driving power supply ELVSS via an organic light-emitting diode (not shown). The organic light-emitting diode may generate light having a predetermined luminance in response to the current.

Each pixel PXL may include a storage unit (not shown) suitable for storing the voltage of a data signal. Here, the capacitance of the storage unit may be changed depending on the driving frequency.

Furthermore, each of the pixels PXL may be coupled to one or more scan lines S depending on the structure of a pixel circuit. In other words, signal lines S and D coupled to each pixel PXL may be set in various forms depending on the circuit structure of the pixel PXL.

Figure 2:
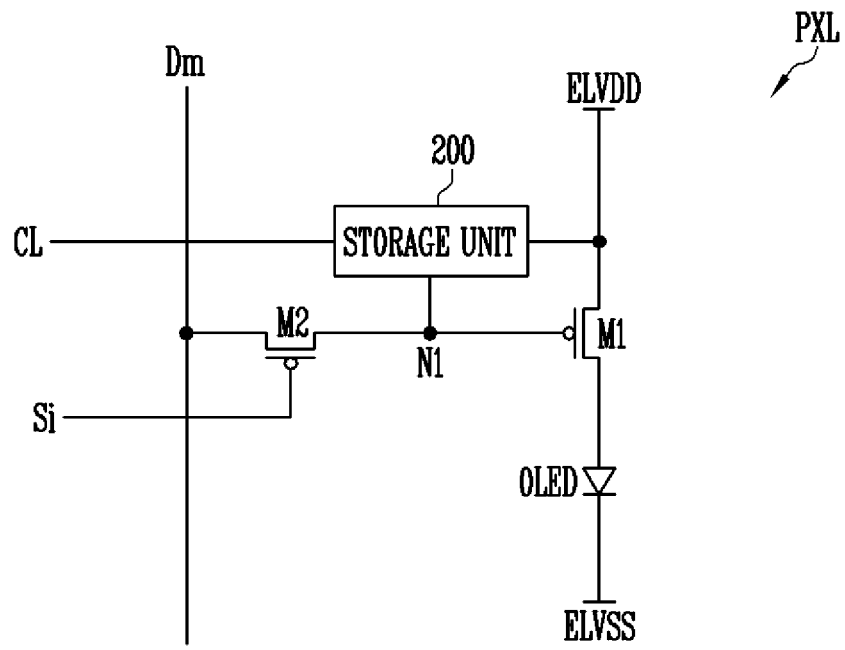
FIG. 2 is a diagram illustrating an exemplary embodiment of a pixel shown in FIG. 1.

FIG. 2 is a diagram illustrating an exemplary embodiment of a pixel shown in FIG. 1. In FIG. 2, for the sake of description, there is illustrated a pixel PXL which is disposed on an i-th (i is a natural number) horizontal line and coupled with an m-th data line Dm.

Referring to FIG. 2, the pixel PXL according to an exemplary embodiment of the inventive concepts may include a first transistor M1, a second transistor M2, a storage unit 200, and an organic light-emitting diode OLED.

An anode electrode of the organic light-emitting diode OLED may be coupled to a second electrode of the first transistor M1, and a cathode electrode thereof may be coupled to the second driving power supply ELVSS. The organic light-emitting diode OLED may emit light having a predetermined luminance corresponding to current supplied from the first transistor M1.

A first electrode of the first transistor M1 (or drive transistor) may be coupled to the first driving power supply ELVDD, and a second electrode thereof may be coupled to the anode electrode of the organic light-emitting diode OLED. A gate electrode of the first transistor M1 may be coupled to a first node N1. The first transistor M1 may control, in response to the voltage of the first node N1, current flowing from the first driving power supply ELVDD to the second driving power supply ELVSS via the organic light-emitting diode OLED. For this operation, the first driving power supply ELVDD may be set to a voltage greater than that of the second driving power supply ELVSS.

The second transistor M2 may be coupled between a data line Dm and the first node N1. A gate electrode of the second transistor M2 may be coupled to a scan line Si. When a scan signal is supplied to the scan line Si, the second transistor M2 may be turned on, and thus, electrically couple the data line Dm with the first node N1.

The storage unit 200 may store the voltage of the data signal. The storage unit 200 may be changed in capacitance in response to the driving frequency. For example, the storage unit 200 may be set to a first capacitance when the organic light-emitting display device is driven with a first driving frequency. The storage unit 200 may be set to a second capacitance greater than the first capacitance when the organic light-emitting display device is driven with a second driving frequency less than the first driving frequency.

For this operation, the storage unit 200 may be operated in response to a control signal supplied from the control signal supply unit 130. For example, the storage unit 200 may be set to a first capacitance when a first control signal is supplied thereto, and to a second capacitance when a second control signal is supplied thereto.

The first driving frequency may be set to a high driving frequency, e.g., a driving frequency of 60 Hz or more. The second driving frequency may be set to a driving frequency less than the first driving frequency, e.g., to a driving frequency less than 60 Hz.

Figure 3:
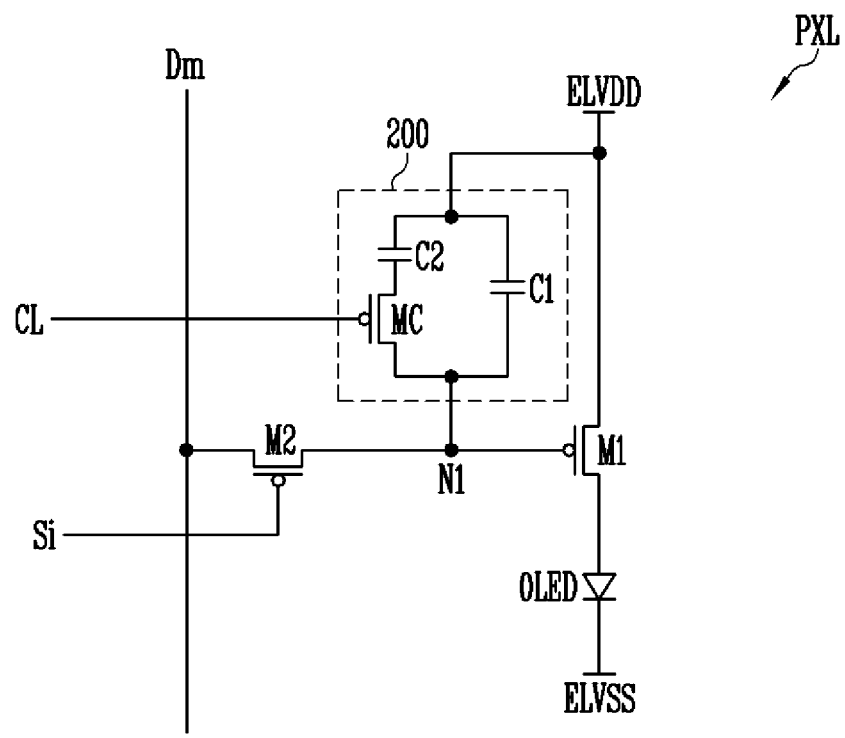
FIG. 3 is a diagram illustrating an exemplary embodiment of a storage unit shown in FIG. 2.

FIG. 3 is a diagram illustrating an exemplary embodiment of the storage unit 200 shown in FIG. 2.

Referring to FIG. 3, the storage unit 200 in accordance with an exemplary embodiment of the inventive concepts may include a first capacitor C1, a second capacitor C2, and a control transistor MC.

The first capacitor C1 may be coupled between the first driving power supply ELVDD and the first node N1.

The second capacitor C2 and the control transistor MC may be coupled in parallel with the first capacitor C1 between the first driving power supply ELVDD and the first node N1. The second capacitor C2 may be set to a capacitance greater than that of the first capacitor C1.

In detail, when the organic light-emitting display device is driven with the first driving frequency, the data signal may be stored in the first capacitor C1. In this case, the first capacitor C1 may be set to a comparatively low capacitance so as to secure a high charging speed in response to the first driving frequency.

When the organic light-emitting display device is driven with the second driving frequency, the data signal is stored in the first capacitor C1 and the second capacitor C2. In this case, the second capacitor C2 may be set to a capacitance greater than that of the first capacitor C1 so that the data signal can be stably maintained during a single frame period in response to the second frequency.

In other words, in an exemplary embodiment of inventive concepts, a capacitance of the second capacitor C2 is set to be greater than that of the first capacitor C1, so that a high driving speed can be secured when the organic light-emitting display device is driven with the first driving frequency, and the voltage of the data signal can be stably maintained during a single frame period when the display device is driven with the second driving frequency.

The second capacitor C2 may be coupled between the first driving power supply ELVDD and the control transistor MC. The control transistor MC may be coupled between the second capacitor C2 and the first node N1. The second capacitor C2 and the control transistor MC may be coupled in series between the first driving power supply ELVDD and the first node N1.

A gate electrode of the control transistor MC may be coupled to the control line CL. The control transistor MC may be turned off when a first control signal is supplied thereto, and may be turned on when a second control signal is supplied thereto. In other words, the control transistor MC may be turned off when the display device is driven with the first driving frequency, and may be turned on when the display device is driven with the second driving frequency.

If the control transistor MC is turned off, the electrical coupling between the second capacitor C2 and the first node N1 may be interrupted. Then, the capacitance of the storage unit 200 may be set to the capacitance of the first capacitor C1. In other words, when the organic light-emitting display device is driven with the first driving frequency, the capacitance of the storage unit 200 may be set to the capacitance of the first capacitor C1.

If the control transistor MC is turned on, the second capacitor C2 and the first node N1 may be electrically coupled with each other. In this case, the capacitance of the storage unit 200 may be set to the sum of the capacitances of the first and second capacitors C1 and C2. In other words, when the organic light-emitting display device is driven with the second driving frequency, the capacitance of the storage unit 200 may be set to the sum of the capacitances of the first and second capacitors C1 and C2.

Figure 4:
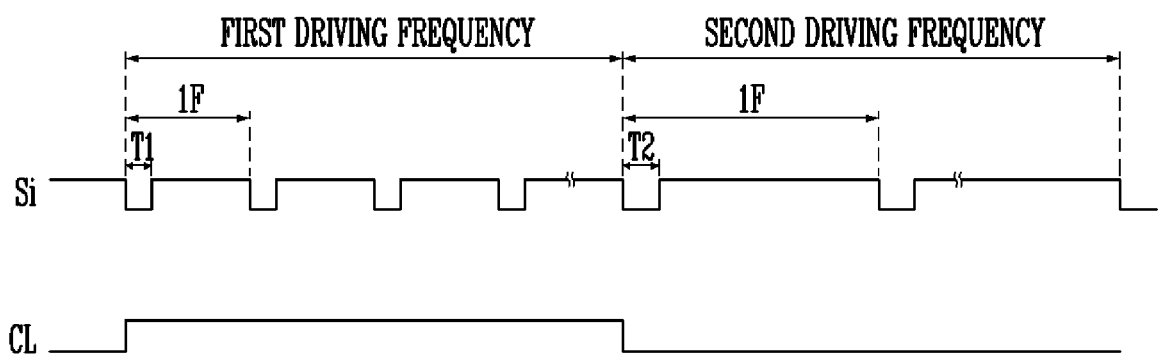
FIG. 4 is a diagram illustrating an exemplary embodiment of a method of driving the pixel shown in FIG. 3.

FIG. 4 is a diagram illustrating an exemplary embodiment of a method of driving the pixel shown in FIG. 3.

Referring to FIG. 4, the organic light-emitting display device may be driven with the first driving frequency and the second driving frequency. Hereinafter, for the sake of explanation, it is assumed that the first driving frequency is 60 Hz and the second driving frequency is 10 Hz.

Figure 5A:
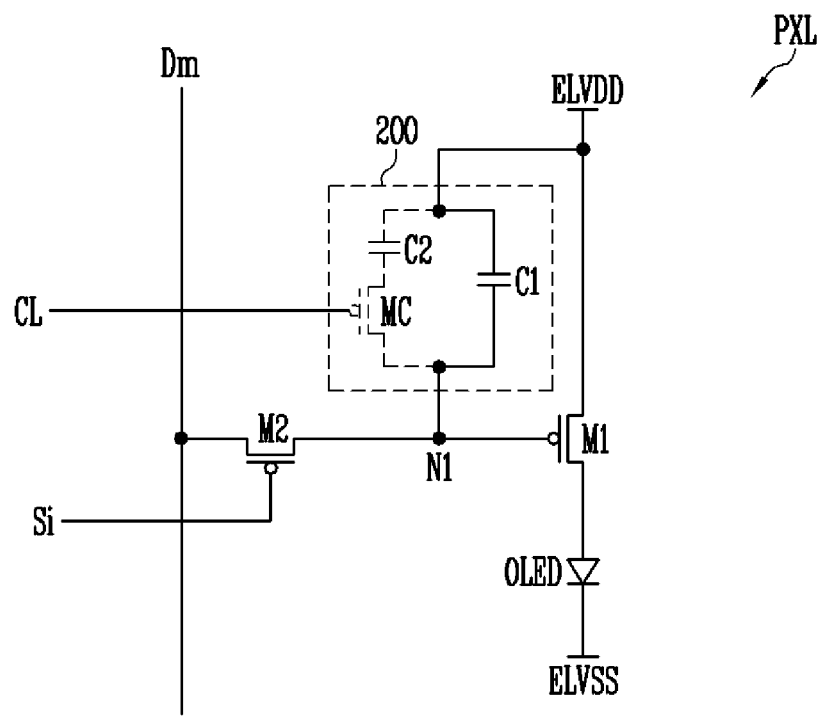
FIG. 5A and FIG. 5B are diagrams illustrating a process of operating a storage unit corresponding to the driving method shown in FIG. 4.

When the organic light-emitting display device is driven with the first driving frequency, the first control signal (i.e., the gate off voltage) is supplied to the control line CL. If the first control signal is supplied to the control line CL, the control transistor MC is turned off, as shown in FIG. 5A. If the control transistor MC is turned off, the second capacitor C2 and the first node N1 are electrically interrupted from each other.

When the organic light-emitting display device is driven with the first driving frequency, a scan signal set to a first width T1 is supplied to the scan line Si. If the scan signal is supplied to the scan line Si, the second transistor M2 is turned on. If the second transistor M2 is turned on, a data signal is supplied from the data line Dm to the first node N1. The data signal supplied to the first node N1 may be stored in the first capacitor C1.

Thereafter, the first transistor M1 may control current to be supplied to the organic light-emitting diode OLED, in response to the voltage of the data signal stored in the first capacitor C1. The luminance of the organic light-emitting diode OLED may be controlled in response to current supplied from the first transistor M1. When the organic light-emitting display device is driven with the first driving frequency, the pixel PXL repeats the foregoing process while it is driven.

When the display device is driven with the first driving frequency, the storage unit 200 is set to the capacitance of the first capacitor C1. Hence, the display device can be stably driven. In detail, when the organic light-emitting display device is driven with the first driving frequency, sixty frames are included every second. Therefore, the data signal is supplied to the pixel PXL sixty times for every second. If the capacitance of the storage unit 200 is set to a comparatively large value, the time it takes to charge the voltage of the data signal is set to a relatively long value. Hence, it is difficult for an image to have a desired luminance.

On the other hand, as described in the present disclosure, if the capacitance of the storage unit 200 is set to the capacitance of the first capacitor C1 that is relatively low, the voltage of the data signal is reliably charged during one frame period 1F. Consequently, the luminance of the image may have a desired value.

Figure 5B:
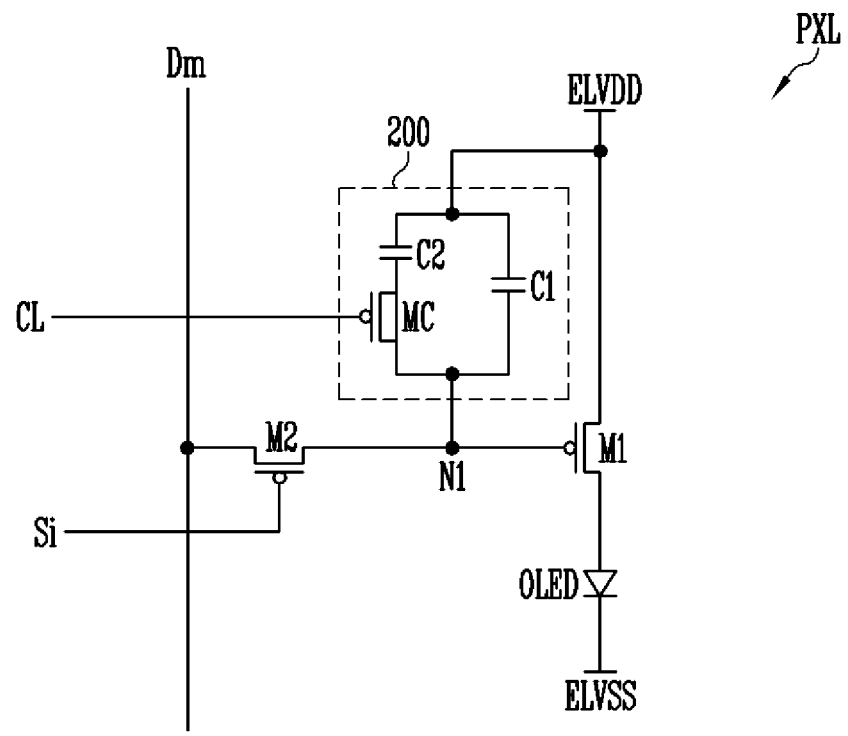

When the organic light-emitting display device is driven with the second driving frequency, the second control signal (i.e., the gate on voltage) is supplied to the control line CL. If the second control signal is supplied to the control line CL, the control transistor MC is turned on, as shown in FIG. 5B. If the control transistor MC is turned on, the second capacitor C2 and the first node N1 are electrically coupled with each other.

When the organic light-emitting display device is driven with the second driving frequency, a scan signal set to a second width T2 is supplied to the scan line Si. Here, the second width T2 may be set to a width equal to or greater than the first width T1. If the scan signal is supplied to the scan line Si, the second transistor M2 is turned on. If the second transistor M2 is turned on, a data signal is supplied from the data line Dm to the first node N1. The data signal supplied to the first node N1 may be stored in the first capacitor C1 and the second capacitor C2.

Thereafter, the first transistor M1 may control current to be supplied to the organic light-emitting diode OLED, in response to the voltage stored in the first capacitor C1 and the second capacitor C2. The luminance of the organic light-emitting diode OLED may be controlled in response to current supplied from the first transistor M1. When the organic light-emitting display device is driven with the second driving frequency, the pixel PXL repeats the foregoing process while it is driven.

When the display device is driven with the second driving frequency, the storage unit 200 is set to the sum of the capacitances of the first and second capacitors C1 and C2. Hence, the display device can be stably driven. In detail, when the organic light-emitting display device is driven with the first driving frequency, ten frames are included every second. In this case, the pixel PXL must maintain the voltage of the data signal during a period of $1/10$ seconds. Hence, the capacitance of the storage unit 200 must be set to a comparatively high value.

To achieve the foregoing purpose, in an exemplary embodiment of the inventive concepts, when the organic light-emitting display device is driven with the second driving frequency, the capacitance of the storage unit 200 is set to the sum of the capacitances of the first and second capacitors C1 and C2. Thereby, the voltage of the data signal may be stably maintained during a period of $1/10$ seconds. In addition, in an exemplary embodiment of the inventive concepts, during a period in which the organic light-emitting display device is driven with the second driving frequency, the scan signal may be set to the second width T2. Here, the second width T2 may be set experimentally such that the first and second capacitors C1 and C2 can be stably charged with the data signal.

Figure 6A:
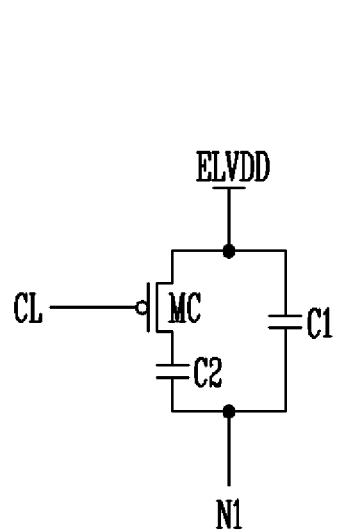
FIG. 6A and FIG. 6B are diagrams illustrating exemplary embodiments of the storage unit shown in FIG. 2.
Figure 6B:
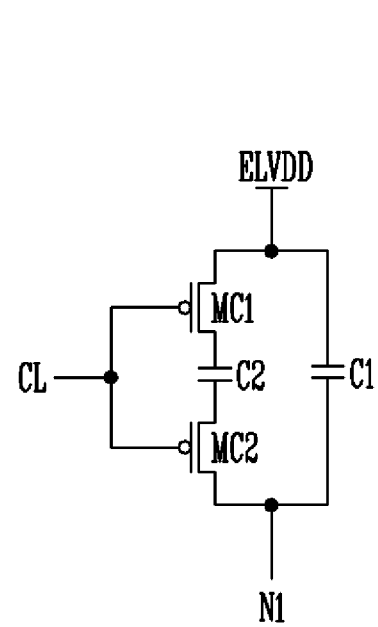

FIGS. 6A and 6B are diagrams illustrating exemplary embodiments of the storage unit 200 shown in FIG. 2. The operation of the storage unit 200 shown in FIGS. 6A and 6B is substantially the same as that of the storage unit 200 shown in FIG. 2; therefore, detailed explanation thereof will be omitted.

Referring to FIG. 6A, the storage unit 200 in accordance with an exemplary embodiment of the inventive concepts may include a first capacitor C1, a second capacitor C2, and a control transistor MC.

The first capacitor C1 may be coupled between the first driving power supply ELVDD and the first node N1.

The second capacitor C2 and the control transistor MC may be coupled in parallel with the first capacitor C1 between the first driving power supply ELVDD and the first node N1. The second capacitor C2 may be set to a capacitance greater than that of the first capacitor C1.

The control transistor MC may be coupled between the second capacitor C2 and the first driving power supply ELVDD. The second capacitor C2 may be coupled between the control transistor MC and the first node N1. The control transistor MC and the second capacitor C2 may be coupled in series between the first driving power supply ELVDD and the first node N1.

A gate electrode of the control transistor MC may be coupled to the control line CL. The control transistor MC may be turned off when a first control signal is supplied thereto, and may be turned on when a second control signal is supplied thereto. In other words, the control transistor MC may be turned off when the display device is driven with the first driving frequency, and may be turned on when the display device is driven with the second driving frequency.

Referring to FIG. 6B, a storage unit 200 in accordance with an exemplary embodiment of the inventive concepts may include a first capacitor C1, a second capacitor C2, and one or more control transistors MC1 and MC2.

The first capacitor C1 may be coupled between the first driving power supply ELVDD and the first node N1.

The second capacitor C2 and the one or more control transistors MC1 and MC2 may be coupled in parallel with the first capacitor C1 between the first driving power supply ELVDD and the first node N1. The second capacitor C2 may be set to a capacitance greater than that of the first capacitor C1.

The first control transistor MC1 may be coupled between the second capacitor C2 and the first driving power supply ELVDD. The second control transistor MC2 may be coupled between the second capacitor C2 and the first node N1. The second capacitor C2 may be coupled between the first control transistor MC1 and the second transistor MC2. In other words, the first control transistor MC1, the second capacitor C2, and the second control transistor MC2 may be coupled in series between the first driving power supply ELVDD and the first node N1.

Gate electrodes of the first and second control transistors MC1 and MC2 may be coupled to the control line CL. The first control transistor MC1 and the second control transistor MC2 may be turned off when a first control signal is supplied thereto, and may be turned on when a second control signal is supplied thereto. The first control transistor MC1 and the second control transistor MC2 may be turned off when the organic light-emitting display device is driven with the first driving frequency, and may be turned on when the display device is driven with the second driving frequency.

Figure 7:
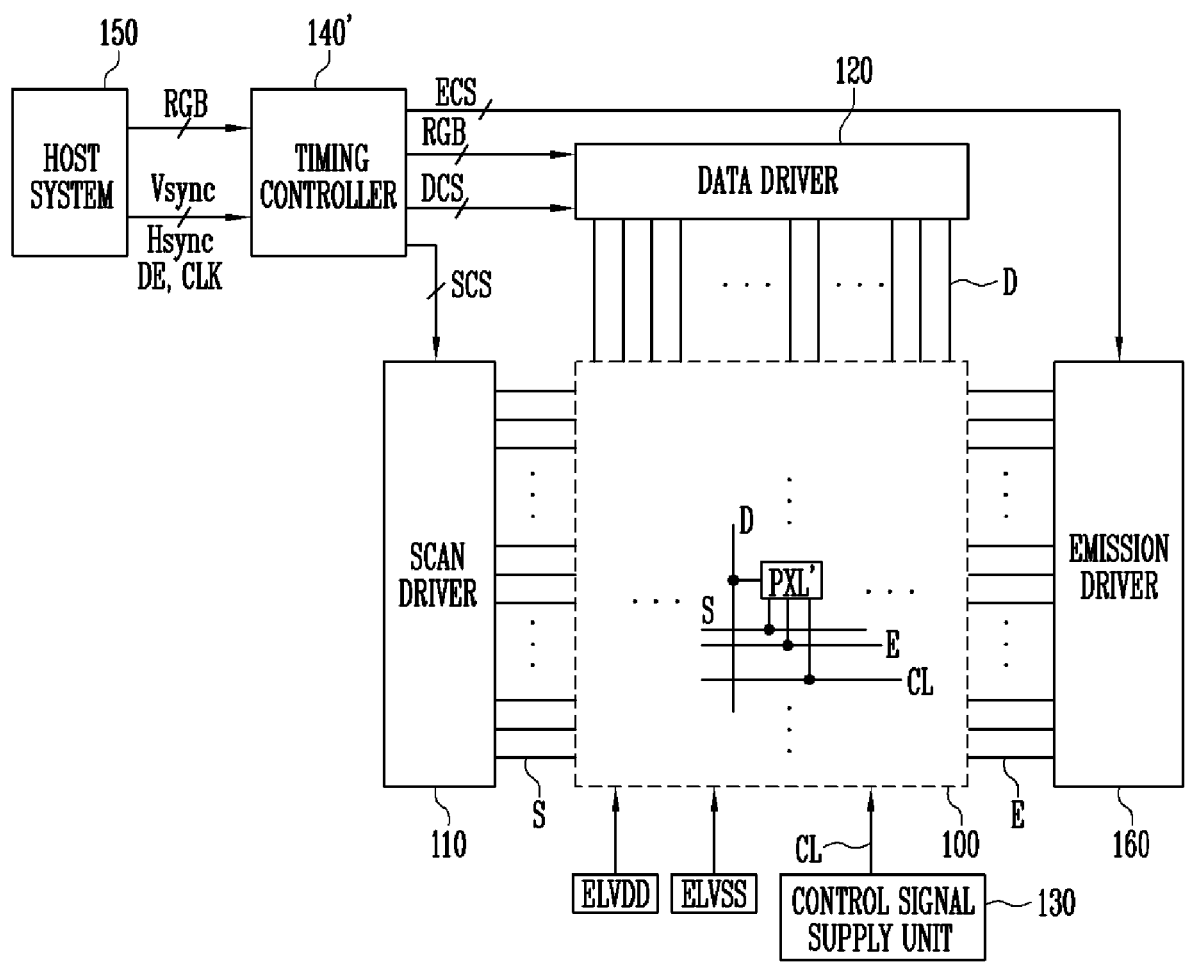
FIG. 7 is a schematic diagram illustrating an organic light-emitting display device in accordance with an exemplary embodiment of the inventive concepts.

FIG. 7 is a schematic diagram illustrating an organic light-emitting display device in accordance with an exemplary embodiment of the inventive concepts. In the following description of FIG. 7, the same reference numerals will be used to designate the same components as those of FIG. 1, and detailed explanation the corresponding components will be omitted.

Referring to FIG. 7, the display device in accordance with an embodiment of the present disclosure may include a pixel unit 100, a scan driver 110, a data driver 120, a control signal supply unit 130, a timing controller 140', a host system 150, and an emission driver 160.

The timing control unit 140' may generate a scan driving control signal SCS, a data driving control signal DCS, and an emission driving control signal ECS based on timing signals, such as image RGB data, a vertical synchronization signal Vsync, a horizontal synchronization signal Hsync, a data enable signal DE, and a clock signal CLK, outputted from the host system 150. The scan driving control signal SCS generated from the timing controller 140' may be supplied to the scan driver 110. The data driving control signal DCS may be supplied to the data driver 120. The emission driving control signal ECS may be supplied to the emission driver 160. The timing controller 140' may rearrange RGB data received from an external device and supply the rearranged RGB data to the data driver 120.

The emission driving control signal ECS may include a light-emitting start pulse and clock signals. The light-emitting start pulse may control a first timing of the emission control signal. The clock signals may be used to shift the light-emitting start pulse.

The emission driver 160 may supply an emission control signal to emission control lines E in response to the emission driving control signal ECS. For example, the emission driver 160 may successively supply the emission control signal to the emission control lines E. If the emission control signal is successively supplied to the emission control lines E, the pixels PXL may enter a non-emission state on a horizontal line basis. For this operation, the emission control signal may be set to a gate-off voltage so that transistors included in the pixels PXL can be turned off.

In addition, an emission control signal which is supplied to an i-th emission control line Ei may overlap a scan signal which is supplied to an i-th scan line Si. Then, pixels PXL disposed on an i-th horizontal line are set to a non-emission state during a period in which the data signal is supplied to the pixels PXL disposed on the i-th horizontal line. Consequently, undesired light may be prevented from being generated by the pixels PXL.

Although the scan driver 110 and the emission driver 160 have been illustrated in FIG. 1 as being separate drivers, the present disclosure is not limited thereto. For example, the scan driver 110 and the emission driver 160 may be formed as a single driver. The scan driver 110 and/or the emission driver 160 may be mounted on a substrate through a thin film process. The scan driver 110 and/or the emission driver 160 may be disposed on each of the opposite sides of the pixel unit 100.

The pixel unit 100 may include pixels PXL' which are disposed to be coupled to the data lines D, the scan lines S, the emission control line E, and the control line CL. The pixels PXL' may be supplied with a first driving power supply ELVDD and a second driving power supply ELVSS from an external device.

Each pixel PXL' may be selected when a scan signal is supplied to the corresponding scan line S coupled with it, and then be supplied with a data signal from the data line D. The pixel PXL' supplied with the data signal may control, in response to the data signal, current flowing from the first driving power supply ELVDD to the second driving power supply ELVSS via an organic light-emitting diode (not shown). The organic light-emitting diode may generate light having a predetermined luminance in response to the current. The time for which each pixel PXL' emits light may be controlled by an emission control signal supplied from the corresponding emission control line E coupled with the pixel PXL'.

Furthermore, the pixels PXL' may be coupled to one or more scan lines S and emission control lines E depending on the structure of a pixel circuit. In other words, signal lines S, E, and D coupled to each pixel PXL' may be set in various forms depending on the circuit structure of the pixel PXL'.

Figure 8:
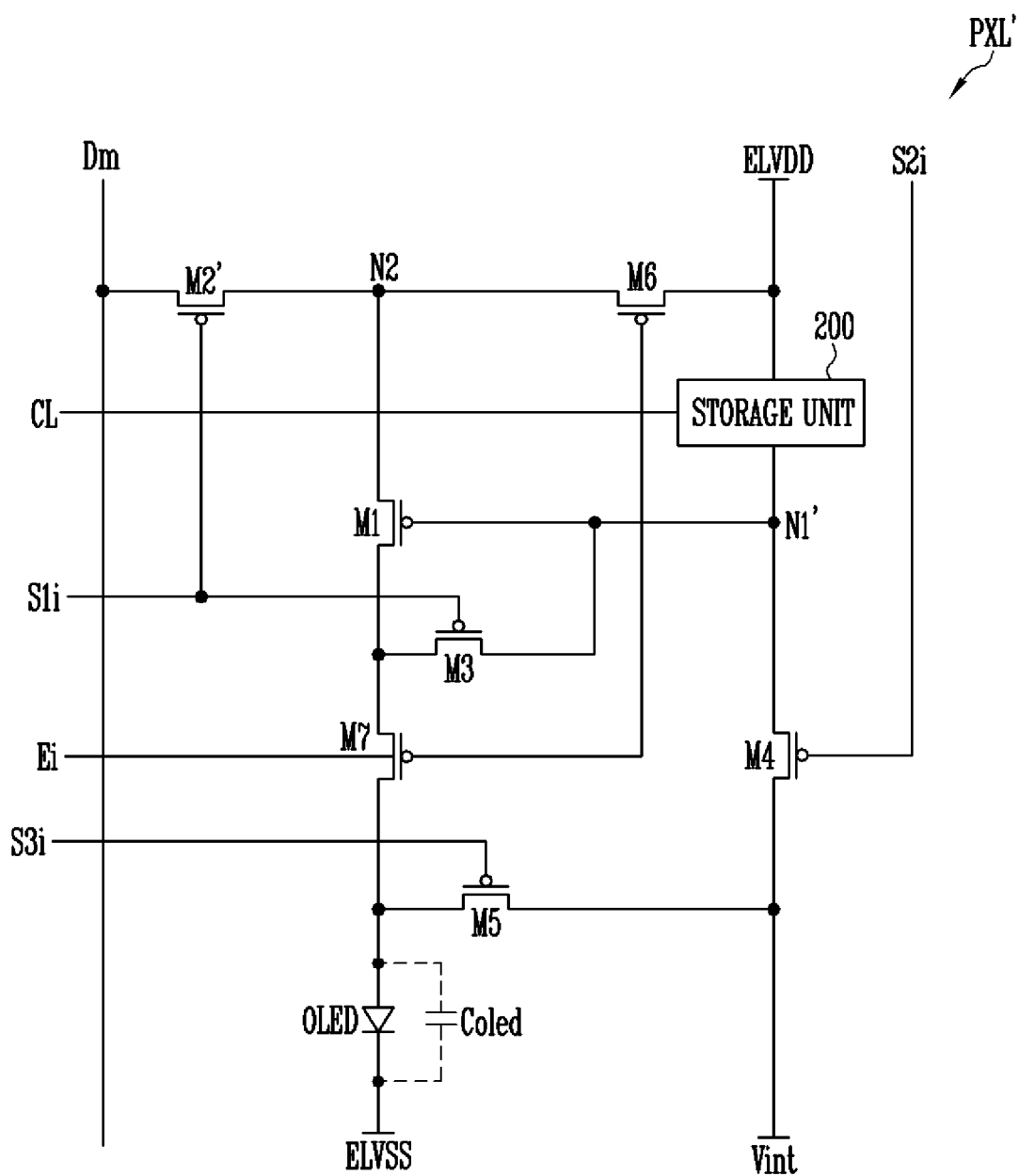
FIG. 8 is a diagram illustrating an exemplary embodiment of a pixel shown in FIG. 7.

FIG. 8 is a diagram illustrating an embodiment of a pixel shown in FIG. 7. In FIG. 8, for the sake of description, there is illustrated a pixel PXL', which is disposed on an i-th horizontal line and coupled with an m-th data line Dm.

Referring to FIG. 8, the pixel PXL' in accordance with an exemplary embodiment of the inventive concepts may include an organic light-emitting diode OLED, first to seventh transistors M1 to M7, and a storage unit 200.

An anode electrode of the organic light-emitting diode OLED may be coupled to a second electrode of the first transistor M1 via the seventh transistor M7, and a cathode electrode thereof may be coupled to the second driving power supply ELVSS. The organic light-emitting diode OLED may emit light having a predetermined luminance corresponding to current supplied from the first transistor M1.

A first electrode of the first transistor M1 (or drive transistor) may be coupled to a second node N2, and a second electrode thereof may be coupled to the anode electrode of the organic light-emitting diode OLED via the seventh transistor M7. A gate electrode of the first transistor M1 may be coupled to a first node N1'. The first transistor M1 may control, in response to the voltage of the first node N1', current flowing from the first driving power supply ELVDD to the second driving power supply ELVSS via the organic light-emitting diode OLED. For this operation, the first driving power supply ELVDD may be set to a voltage higher than that of the second driving power supply ELVSS.

The second transistor M2' may be coupled between a data line Dm and the second node N2. A gate electrode of the second transistor M2' may be coupled to an i-th first scan line S1i. When a scan signal is supplied to the i-th first scan line S1i, the second transistor M2' may be turned on, and thus, electrically couple the data line Dm with the second node N2.

The third transistor M3 may be coupled between the second electrode of the first transistor M1 and the first node N1'. A gate electrode of the third transistor M3 may be coupled to the i-th first scan line S1i. The third transistor M3 may be turned on when a scan signal is supplied to the i-th first scan line S1i.

The fourth transistor M4 may be coupled between the first node N1' and an initialization power supply Vint. A gate electrode of the fourth transistor M4 may be coupled to an i-th second scan line S2i. When a scan signal is supplied to the i-th second scan line S2i, the fourth transistor M4 may be turned on and thus supply the voltage of the initialization power supply Vint to the first node N1'. The initialization power supply Vint may be set to a voltage less than the data signal supplied to the data line Dm. The scan signal to be supplied to the i-th second scan line S2i may be supplied earlier than the scan signal to be supplied to the i-th first scan line S1i. Therefore, the i-th second scan line S2i may be set to an i−1-th first scan line S1i−1.

The fifth transistor M5 may be coupled between the anode electrode of the organic light-emitting diode OLED and the initialization power supply Vint. A gate electrode of the fifth transistor M5 may be coupled to an i-th third scan line S3i. When a scan signal is supplied to the i-th third scan line S3i, the fifth transistor M5 may be turned on, and thus, supply the voltage of the initialization power supply Vint to the anode electrode of the organic light-emitting diode OLED. The scan signal to be supplied to the i-th third scan line S3i may overlap an emission control signal to be supplied to the emission control line Ei. Hence, the i-th third scan line S3i may be set to the i-th first scan line S1i or the i-th second scan line S2i.

When the voltage of the initialization power supply Vint is supplied to the anode electrode of the organic light-emitting diode OLED, a parasitic capacitor (hereinafter, referred to as "organic capacitor (Coled)") of the organic light-emitting diode OLED may be discharged. When the organic capacitor Coled is discharged, the black expression performance of the pixel PXL may be enhanced.

In detail, the organic capacitor Coled may charge, during a preceding frame period, a predetermined voltage corresponding to current supplied from the first transistor M1. If the organic capacitor Coled is charged, the organic light-emitting diode OLED may easily emit light even at low current.

A black data signal may be supplied during a current frame period. If the black data signal is supplied, the first transistor M1 must not supply current to the organic light-emitting diode OLED, ideally. However, even when the black data signal is supplied, some leakage current may be supplied to the organic light-emitting diode OLED. In this case, if the organic capacitor Coled is in a charged state, the organic light-emitting diode OLED may slightly emit light. Thus, the black expression performance may be reduced.

On the other hand, in the case where the organic capacitor Coled is discharged by the initialization power supply Vint as described in the present disclosure, the organic light-emitting diode OLED may be set to a non-emission state by the leakage current. In other words, in the present disclosure, the organic capacitor Coled is discharged using the initialization power supply Vint, whereby the black expression performance may be enhanced.

The sixth transistor M6 may be coupled between the first driving power supply ELVDD and the second node N2. A gate electrode of the sixth transistor M6 may be coupled to an i-th emission control line Ei. The sixth transistor M6 may be turned off when an emission control signal is supplied to the i-th emission control line Ei, and may be turned on when an emission control signal is not supplied thereto.

The seventh transistor M7 may be coupled between the second electrode of the first transistor M1 and the anode electrode of the organic light-emitting diode OLED. A gate electrode of the seventh transistor M7 may be coupled to an i-th emission control line Ei. The seventh transistor M7 may be turned off when an emission control signal is supplied to the i-th emission control line Ei, and may be turned on when an emission control signal is not supplied thereto.

The storage unit 200 may store the voltage of the data signal. The storage unit 200 may be changed in capacitance in response to the driving frequency. For example, the storage unit 200 may be set to a first capacitance when the organic light-emitting display device is driven with a first driving frequency. The storage unit 200 may be set to a second capacitance greater than the first capacitance when the organic light-emitting display device is driven with a second driving frequency less than the first driving frequency. The storage unit 200 may be set to any one of the circuits of FIGS. 3, 6A, and 6B. For example, the storage unit 200 may include a first capacitor C1, a second capacitor C2, and a control transistor MC, as shown in FIG. 9.

Figure 9:
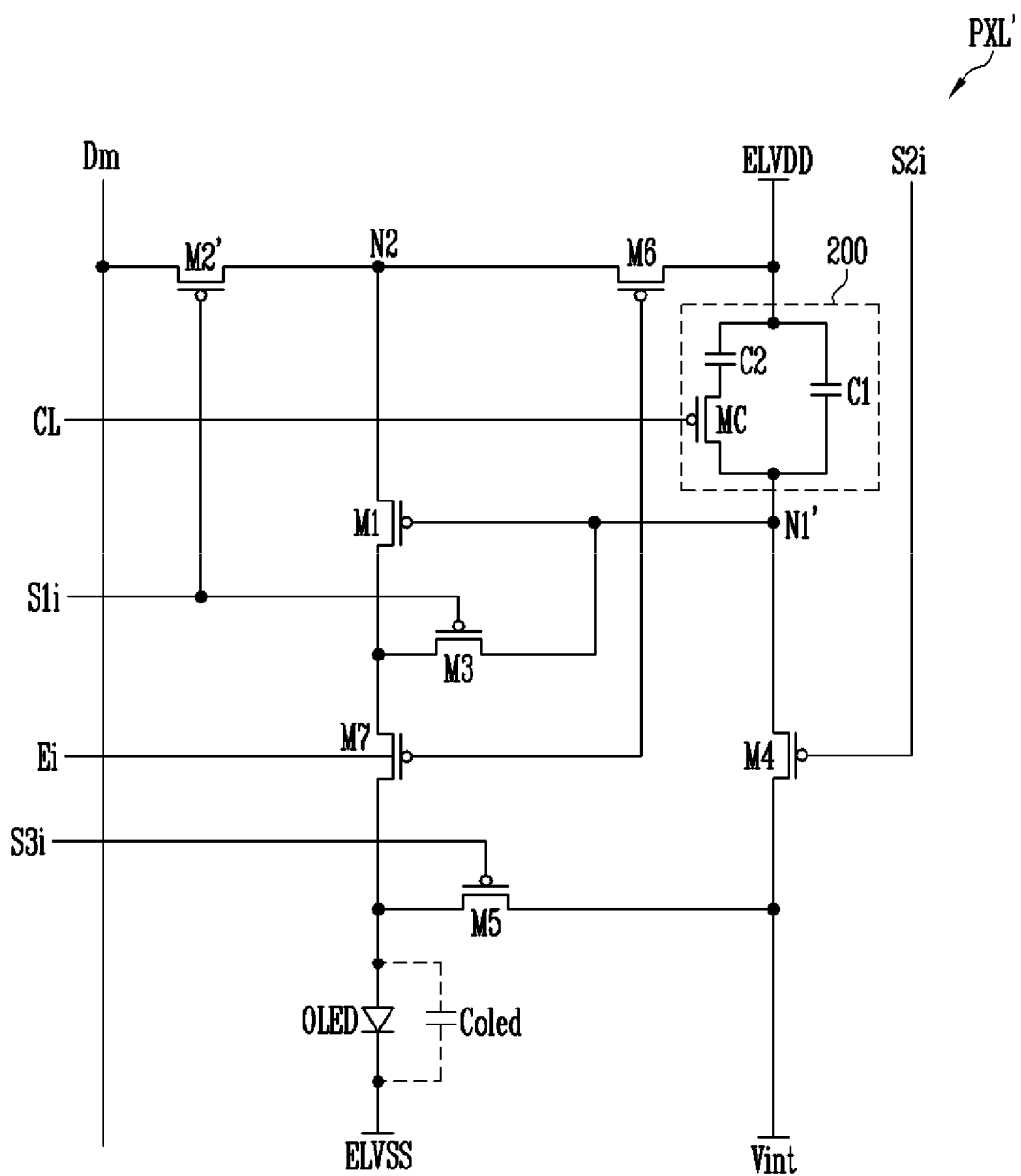
FIG. 9 is a diagram illustrating an exemplary embodiment of a storage unit shown in FIG. 8.
Figure 10:
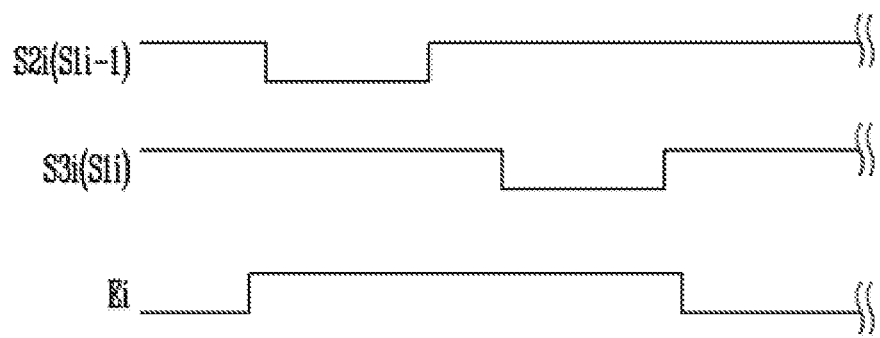
FIG. 10 is a waveform diagram illustrating an exemplary embodiment of a method of driving the pixel shown in FIG. 9.

FIG. 10 is a waveform diagram illustrating an exemplary embodiment of a method of driving the pixel PXL' shown in FIG. 9. In FIG. 10, it is assumed that the i-th second scan line S2i is set to the i−1-th first scan line S1i−1, and the i-th third scan line S3i is set to the i-th first scan line S1i. Here, a scan signal to be supplied to the i−1-th first scan line S1i−1 and the i-th first scan line S1i may overlap an emission control signal to be supplied to the i-th emission control line Ei.

Referring to FIG. 10, an emission control signal may be supplied to the i-th emission control line Ei before a scan signal is supplied to the i-th second scan line S2i.

If the emission control signal is supplied to the i-th emission control line Ei, the sixth transistor M6 and the seventh transistor M7 are turned off.

When the sixth transistor M6 is turned off, the first driving power supply ELVDD and the second node N2 are electrically interrupted from each other. When the seventh transistor M7 is turned off, the first transistor M1 and the organic light-emitting diode OLED are electrically interrupted from each other. Therefore, during a period in which the emission control signal is supplied to the i-th emission control line Ei, the pixel PXL' is set to a non-emission state.

If a scan signal is supplied to the i-th second scan line S2i, the fourth transistor M4 is turned on. When the fourth transistor M4 is turned on, the voltage of the initialization power supply Vint is supplied to the first node N1'.

Thereafter, a scan signal is supplied to the i-th first scan line S1i. If a scan signal is supplied to the i-th first scan line S1i, the second transistor M2', the third transistor M3, and the fifth transistor M5 are turned on.

When the fifth transistor M5 is turned on, the voltage of the initialization power supply Vint is supplied to the anode electrode of the organic light-emitting diode OLED. If the voltage of the initialization power supply Vint is supplied to the anode electrode of the organic light-emitting diode OLED, the organic capacitor Coled is discharged, whereby the black expression performance may be enhanced.

When the third transistor M3 is turned on, the second electrode of the first transistor M1 and the first node N1' are electrically coupled to each other. In other words, the first transistor M1 may be coupled in the form of a diode.

When the second transistor M2 is turned on, a data signal is supplied from the data line Dm to the second node N2. Here, since the first node N1' has been initialized to the voltage of the initialization power supply Vint that is less than the voltage of the data signal, the first transistor M1 is turned on.

When the first transistor M1 is turned on, the data signal supplied to the second node N2 is supplied to the first node N1' via the first transistor M1 that is coupled in the form of a diode. Here, a voltage corresponding to the data signal and the threshold voltage of the first transistor M1 is applied to the first node N1'. The storage unit 200 stores the voltage of the first node N1'.

After the voltage corresponding to the data signal and the threshold voltage of the first transistor M1 has been stored in the storage unit 200, the supply of the emission control signal to the i-th emission control line Ei is interrupted. If the supply of the emission control signal to the i-th emission control line Ei is interrupted, the sixth transistor M6 and the seventh transistor M7 are turned off.

When the sixth transistor M6 is turned on, the first driving power supply ELVDD and the second node N2 are electrically coupled to each other. When the seventh transistor M7 is turned on, the second electrode of the first transistor M1 and the anode electrode of the organic light-emitting diode OLED are electrically coupled to each other. The first transistor M1 may control, in response to the voltage applied to the first node N1', current flowing from the first driving power supply ELVDD to the second driving power supply ELVSS via the organic light-emitting diode OLED.

The storage unit 200 may be set to the capacitance of the first capacitor C1 when the display device is driven with the first driving frequency, and may be set to the sum of the capacitances of the first and second capacitors C1 and C2 when the display device is driven with the second driving frequency.

In other words, the control transistor MC may be turned off when the display device is driven with the first driving frequency, and may be turned on when the display device is driven with the second driving frequency. If the control transistor MC is turned off, the electrical coupling between the second capacitor C2 and the first node N1 is interrupted. Then, the capacitance of the storage unit 200 is set to the capacitance of the first capacitor C1. In other words, when the organic light-emitting display device is driven with the first driving frequency, the capacitance of the storage unit 200 is set to the capacitance of the first capacitor C1.

If the control transistor MC is turned on, the second capacitor C2 and the first node N1 are electrically coupled with each other. In this case, the capacitance of the storage unit 200 is set to the sum of the capacitances of the first and second capacitors C1 and C2. In other words, when the organic light-emitting display device is driven with the second driving frequency, the capacitance of the storage unit 200 is set to the sum of the capacitances of the first and second capacitors C1 and C2.

Figure 11:
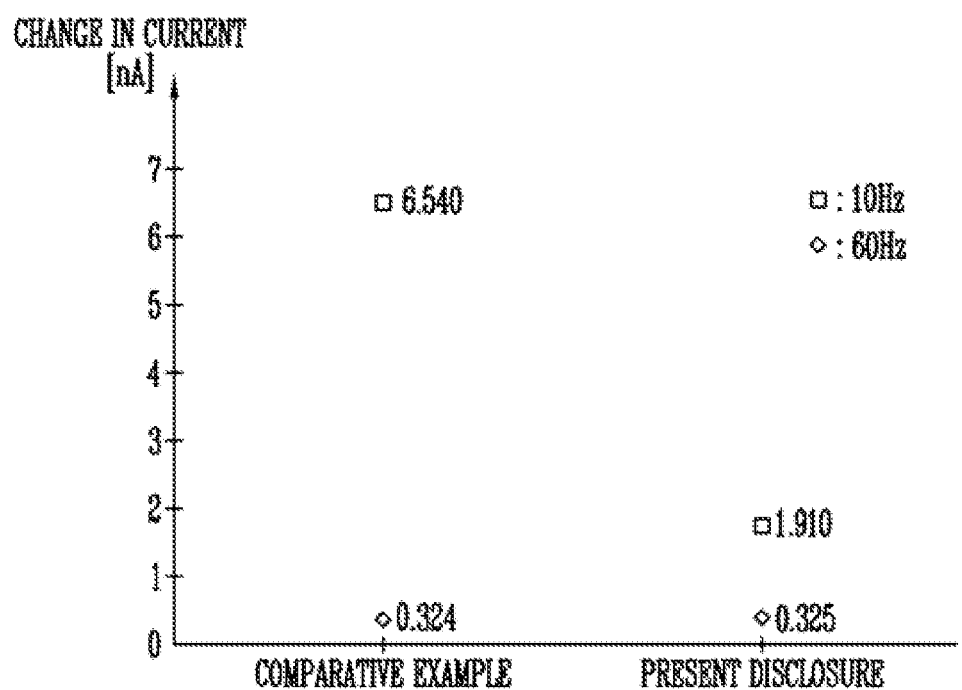
FIG. 11 is a diagram illustrating the result of a simulation in accordance with an exemplary embodiment of the inventive concepts.

FIG. 11 is a diagram illustrating the result of a simulation in accordance with an exemplary embodiment of the inventive concepts. In FIG. 11, the present disclosure refers to the pixel of FIG. 9, and the comparative example refers to a pixel formed by removing the second capacitor C2 and the control transistor MC from the pixel of FIG. 9.

Furthermore, FIG. 11 illustrates the case where the capacitance of the second capacitor C2 is three times the capacitance of the first capacitor C1. The capacitor of the comparative example is set to ⅓ of the sum of the capacitances of the first and second capacitors C1 and C2.

Referring to FIG. 11, when the organic light-emitting display device is driven with the first driving frequency, a current change in the comparative example during a single frame period is set to 0.324 nA, and a current change in the present disclosure is set to 0.325 nA. In other words, when the organic light-emitting display device is driven with the first driving frequency, the comparative example and the present disclosure are set to approximately the same value in the current change.

When the organic light-emitting display device is driven with the second driving frequency, the current change in the comparative example during a single frame period is set to 6.540 nA, and the current change in the present disclosure is set to 1.910 nA. As such, when the organic light-emitting display device is driven with the second driving frequency, the current change in the present disclosure is set to approximately ⅓ of that of the comparative example or less.

Although in the above description each transistor has been illustrated as being a PMOS transistor, the present disclosure is not limited thereto. In other words, each transistor may be embodied by an NMOS transistor.

According to an organic light-emitting display device and a method of driving the same in accordance with an exemplary embodiment of the inventive concepts, the capacity of a storage unit for storing a data signal may be changed in response to a driving frequency. In detail, when the organic light-emitting display device is driven with a first driving frequency, the storage unit is set to a first capacitance. When the display device is driven with a second driving frequency less than the first driving frequency, the storage unit is set to a second capacitance greater than the first capacitance.

Then, when the organic light-emitting display device is driven with the first driving frequency, the driving speed (charging speed) of the display device is increased. When the display device is driven with the second driving frequency, the data signal may be stably maintained during a single frame period. Particularly, in the case where the data signal is stably maintained during a single frame period when the display device is driven with the second driving frequency, the display quality may be enhanced.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. An organic light-emitting display device comprising pixels coupled to scan lines and data lines, each of the pixels comprising a storage unit configured to store a data signal supplied to the data lines, the storage unit set to a first capacitance in the case that the organic light-emitting display device is driven with a first driving frequency, and set to a second capacitance greater than the first capacitance in the case that the organic light-emitting display device is driven with a second driving frequency less than the first driving frequency, wherein:
the storage unit comprises a first capacitor and a second capacitor; and
the storage unit is set to a capacitance of the first capacitor in the case that the organic light-emitting display device is driven with the first driving frequency, and is set to a sum of capacitances of the first and second capacitors in the case that the organic light-emitting display device is driven with the second driving frequency.

2. The organic light-emitting display device according to claim 1, wherein each of pixels disposed in an i-th (i is a natural number) horizontal line comprises:
an organic light-emitting diode;
a first transistor comprising a first electrode, and configured to control, in response to the data signal, current flowing from a first driving power supply coupled to the first electrode to a second driving power supply via the organic light-emitting diode; and
the storage unit coupled between a gate electrode of the first transistor and the first driving power supply.

3. The organic light-emitting display device according to claim 2, wherein:
the storage unit further comprises a control transistor;
the first capacitor is coupled between the first driving power supply and the gate electrode of the first transistor; and
the second capacitor and the control transistor are coupled in parallel with the first capacitor between the first driving power supply and the gate electrode of the first transistor.

4. The organic light-emitting display device according to claim 3, wherein the second capacitor is set to a capacitance greater than a capacitance of the first capacitor.

5. The organic light-emitting display device according to claim 3, wherein the control transistor is coupled between the second capacitor and the gate electrode of the first transistor.

6. The organic light-emitting display device according to claim 3, wherein the control transistor is coupled between the second capacitor and the first driving power supply.

7. The organic light-emitting display device according to claim 3, wherein the control transistor comprises:
a first control transistor coupled between the second capacitor and the first driving power supply; and
a second control transistor coupled between the second capacitor and the gate electrode of the first transistor.

8. The organic light-emitting display device according to claim 3, wherein the control transistor is turned off in the case that the organic light-emitting display device is driven with the first driving frequency, and the control transistor is turned on in the case that the organic light-emitting display device is driven with the second driving frequency less than the first driving frequency.

9. The organic light-emitting display device according to claim 8, further comprising:
a control signal supply unit configured to supply a control signal to a control line coupled in common with the pixels such that the control transistor is turned off in the case that the organic light-emitting display device is driven with the first driving frequency, and the control transistor is turned on in the case that the organic light-emitting display device is driven with the second driving frequency.

10. The organic light-emitting display device according to claim 2, wherein each of the pixels further comprises a second transistor coupled between the corresponding data line and the gate electrode of the first transistor and configured to be turned on in response to a scan signal supplied to an i-th scan line.

11. The organic light-emitting display device according to claim 2, further comprising:
a scan driver configured to supply a scan signal to the scan lines; and
a data driver configured to supply the data signal to the data lines.

12. The organic light-emitting display device according to claim 2, further comprising an emission driver configured to supply an emission control signal to emission control lines coupled to the pixels.

13. The organic light-emitting display device according to claim 12, wherein each of the pixels further comprises:
a second transistor coupled between the first electrode of the first transistor and the corresponding data line, and configured to be turned on in response to a scan signal supplied to an i-th scan line;
a third transistor coupled between a second electrode and the gate electrode of the first transistor, and configured to be turned on in response to the scan signal supplied to the i-th scan line;
a fourth transistor coupled between the gate electrode of the first transistor and an initialization power supply, and configured to be turned on in response to the scan signal supplied to the i−1-th scan line;
a fifth transistor coupled between an anode electrode of the organic light-emitting diode and the initialization power supply, and configured to be turned on in response to the scan signal supplied to the i-th scan line;
a sixth transistor coupled between the first electrode of the first transistor and the first driving power supply, and configured to be turned off in response to an emission control signal supplied to an i-th emission control line; and
a seventh transistor coupled between the second electrode of the first transistor and the anode electrode of the organic light-emitting diode, and configured to be turned off in response to the emission control signal supplied to the i-th emission control line.

14. The organic light-emitting display device according to claim 13, wherein the emission control signal to be supplied to the i-th emission control line overlaps the scan signal to be supplied to the i−1-th scan line and the i-th scan line.

15. A method of driving an organic light-emitting display device comprising pixels, each of which comprises a storage unit suitable for storing a data signal, comprising:

setting the storage unit to a first capacitance in the case that the organic light-emitting display device is driven with a first driving frequency; and setting the storage unit to a second capacitance different from the first capacitance in the case that the organic light-emitting display device is driven with a second driving frequency less than the first driving frequency, wherein:

the storage unit comprises a first capacitor and a second capacitor; and the method further comprises:

setting the storage unit to a capacitance of the first capacitor in the case that the organic light-emitting display device is driven with the first driving frequency; and setting the storage unit to a sum of capacitances of the first and second capacitors in the case that the organic light-emitting display device is driven with the second driving frequency.

16. The method according to claim 15, wherein the second capacitance is set to a value greater than the first capacitance.

17. The method according to claim 15, wherein the second capacitor is set to a capacitance greater than a capacitance of the first capacitor.

18. The method according to claim 15, further comprising:

setting a scan signal to be supplied to the pixels to a first width in the case that the organic light-emitting display device is driven with the first driving frequency; and setting a scan signal to be supplied to the pixels to a second width equal to or greater than the first width in the case that the organic light-emitting display device is driven with the second driving frequency.

* * * * *